United States Patent
Hartner et al.

(10) Patent No.: US 6,852,240 B2
(45) Date of Patent: Feb. 8, 2005

(54) METHOD OF MANUFACTURING A FERROELECTRIC CAPACITOR CONFIGURATION

(75) Inventors: Walter Hartner, München (DE); Günther Schindler, München (DE); Volker Weinrich, München (DE); Igor Kasko, München (DE)

(73) Assignee: Infineon Technologies AG, Munich (DE)

( * ) Notice: Subject to any disclaimer, the term of this patent is extended or adjusted under 35 U.S.C. 154(b) by 44 days.

(21) Appl. No.: 09/793,350

(22) Filed: Feb. 26, 2001

(65) Prior Publication Data

US 2001/0022292 A1 Sep. 20, 2001

(30) Foreign Application Priority Data

Feb. 25, 2000 (DE) .......................................... 100 10 288

(51) Int. Cl.[7] .............................................. H01G 13/00
(52) U.S. Cl. .............................. 216/6; 216/74; 438/240; 438/255
(58) Field of Search ................................ 216/6, 72, 74; 438/239, 240, 244, 255, 393, 396

(56) References Cited

U.S. PATENT DOCUMENTS

| | | | | |
|---|---|---|---|---|
| 4,860,254 A | * | 8/1989 | Pott et al. .................... | 365/145 |
| 5,280,444 A | * | 1/1994 | Motonami et al. ........... | 365/149 |
| 5,495,438 A | | 2/1996 | Omura | |
| 5,744,832 A | * | 4/1998 | Wolters et al. ............... | 257/295 |
| 5,940,705 A | * | 8/1999 | Lee et al. .................... | 438/258 |
| 6,051,858 A | * | 4/2000 | Uchida et al. ............... | 257/295 |
| 6,511,718 B1 | * | 1/2003 | Paz de Araujo et al. .... | 427/576 |
| 6,515,843 B2 | * | 2/2003 | Nakabayashi et al. ....... | 361/305 |

FOREIGN PATENT DOCUMENTS

| | | |
|---|---|---|
| DE | 198 30 569 C1 | 11/1999 |
| EP | 0 720 172 A2 | 7/1996 |
| JP | 11-39860 | 2/1999 |
| JP | 11-168174 | 6/1999 |
| JP | 11 220 105 A | 8/1999 |

* cited by examiner

*Primary Examiner*—Lan Vinh
(74) *Attorney, Agent, or Firm*—Laurence A. Greenberg; Werner H. Stemer; Ralph E. Locher

(57) ABSTRACT

A ferroelectric capacitor configuration is configured with at least two different coercitive voltages. A first electrode structure having a surface which forms at least two levels is firstly produced. A layer of ferroelectric material of varying thickness is deposited over the first electrode by spin coating. A second electrode structure is subsequently formed on the layer of ferroelectric material.

3 Claims, 1 Drawing Sheet

METHOD OF MANUFACTURING A FERROELECTRIC CAPACITOR CONFIGURATION

BACKGROUND OF THE INVENTION

Field of the Invention

The invention relates to a method of manufacturing a ferroelectric capacitor configuration having at least two different coercitive voltages.

It is a current objective of semiconductor technology to develop nonvolatile memories with a ferroelectric material as capacitor material, namely so-called FeRAMs (ferroelectric random-access memories). Ferroelectric materials have a hysteresis which makes it possible to store information permanently in accordance with the two polarization states present without the application of an electric voltage.

In order to switch over the polarization, and thus also the information, from one state into the other state, a certain minimum voltage, the so-called coercitive voltage Vc, has to be applied to the capacitor.

Commonly assigned German patent DE 198 30 569 (see copending application Ser. No. 09/756,085) discloses an FeRAM configuration in which a plurality of capacitors with different coercitive voltages are connected to a selector transistor. That FeRAM configuration is capable of storing a plurality of bits on the basis of the different coercitive voltages of the capacitors. Variations in material or layer thicknesses are proposed in order to implement the different coercitive voltages of the corresponding ferroelectric thin layers.

It is a disadvantage that such ferroelectric thin layers with different coercitive voltages have to be applied in different operations, each with different operating parameters.

SUMMARY OF THE INVENTION

The object of the present invention is to provide a method of manufacturing a ferroelectric capacitor configuration with two or more different coercitive voltages which overcomes the above-noted deficiencies and disadvantages of the prior art devices and methods of this general kind, and which method can be carried out at low cost.

With the above and other objects in view there is provided, in accordance with the invention, a method of manufacturing a ferroelectric capacitor configuration with at least two different coercitive voltages, which comprises the following steps:

forming a first electrode structure with at least two different levels;

spin-coating a layer of ferroelectric material of varying thickness onto the first electrode structure; and producing a second electrode structure on the layer of ferroelectric material;

Accordingly, the basic idea of the invention is to provide a topology of the first electrode structure which has at least two different levels in order to bring about a variation in thickness of the layer of ferroelectric material. This makes use of the fact that the spin coating method which is used to deposit the layer of ferroelectric material has a leveling effect, i.e. smaller layer thicknesses are produced over raised regions of the first electrode structure than over countersunk regions of the first electrode structure.

With the novel process according to the invention, the layer of ferroelectric material with varying layer thickness is deposited advantageously in terms of cost in a single operation.

The different levels of the first electrode structure can be manufactured in different ways.

A first preferred variant of the method is characterized by the fact that the two levels are produced directly by etching a step into the first electrode structure. In this procedure, the first electrode structure must have a sufficient layer thickness.

In accordance with another variant of the method, before the first electrode structure is produced, a step is formed in a barrier layer. During the deposition of the electrode structure, the barrier layer step is transferred to the electrode structure.

A third preferred variant of the method is characterized by the fact that, before the first electrode structure is produced, a step is formed in an auxiliary layer arranged over a substrate, or in the substrate itself in order to bring about the two different levels.

The capacitor configuration can be implemented in the form of a single capacitor with ferroelectric-substance layer sections with different coercitive voltages. Such a capacitor then has a plurality of switching points (i.e. more than two storage states). Another possibility is to form two or more capacitors in the capacitor configuration. This is done by dividing the first electrode structure or the second electrode structure or even both electrode structures at suitable processing times.

Other features which are considered as characteristic for the invention are set forth in the appended claims.

Although the invention is illustrated and described herein as embodied in a method of manufacturing a ferroelectric capacitor configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
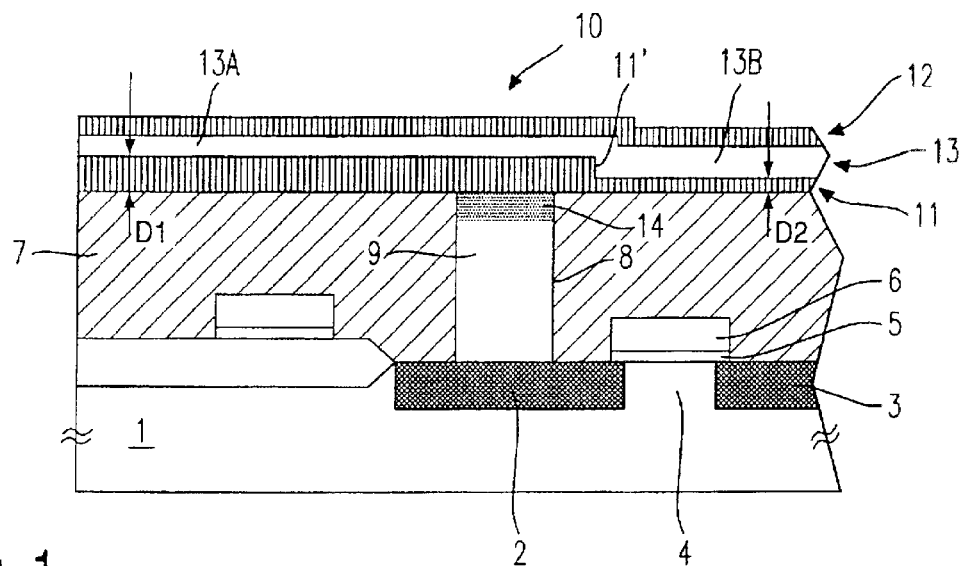
FIG. 1 is a schematic sectional view of an FeRAM memory cell with switching transistor and ferroelectric capacitor configuration composed of a capacitor, illustrating a first exemplary embodiment of the invention.

Referring now to the figures of the drawing in detail and first, particularly, to FIG. 1 thereof, there is seen a schematic view which serves to clarify a process according to the invention for manufacturing a ferroelectric capacitor configuration, with reference to the example of an FeRAM memory cell.

An N-type channel MOS transistor is built up on, for example, a p-type doped Si semiconductor substrate (wafer)

1 by means of customary planar methods (layer deposition, layer structuring using lithographic and etching techniques, layer doping). An n$^+$-doped drain region 2 is separated from an n$^+$-doped source region 3 by means of an intermediate channel 4 made of substrate material. Above the channel 4 there is a thin gate oxide layer 5. A gate electrode 6, which forms the word line of the memory cell, is provided on the gate oxide layer 5.

A covering oxide layer 7 is deposited on the MOS transistor 2, 3, 4, 5, 6. A contact hole 8 is made in the covering oxide layer 7. The contact hole 8 is filled with an electrical connecting structure 9 (so-called "plug") composed, for example, of doped polysilicon or of a metal.

Instead of the MOS transistor 2, 3, 4, 5, 6 illustrated here, it is also possible to provide some other monolithic semiconductor functional element.

A ferroelectric capacitor configuration 10 is formed above the covering oxide layer 7 in a manner according to the invention.

The capacitor configuration 10 has a lower electrode structure 11 (bottom electrode), an upper electrode structure 12 (top electrode) and a ferroelectric capacitor material 13 between them. Between the lower electrode structure 11 and the connecting structure 9 there is, if necessary, a barrier layer 14 whose function is to prevent a high-impedance depletion layer building up at the connecting structure 9 as a result of oxygen diffusing through the electrode structure 11.

The two electrode structures 11, 12 are composed of an inert material such as Pt, Ir or Ru. The ferroelectric material 13 can be, for example, $SrBi_2Ta_2O_5$ [SBT], $SrBi_2Ta_{2-x}Nb_xO_9$ [SBTN] or else other ferroelectric materials such as Pb(Zr, Ti)O [PZT], BiTiO [BTO], PLZT, BZTO etc. The barrier layer 14 can be formed, for example, from $IrO_2$.

The ferroelectric material 13 has at least two sections 13A, 13B with different layer thicknesses. The result of the different layer thicknesses is that the capacitor configuration 10 has different coercitive voltages Vc1, Vc2. The coercitive voltage Vc1 in the section 13A with the smaller layer thickness is lower than the coercitive voltage Vc2 in the section 13B with a larger layer thickness, i.e. the switching over between the two polarization states takes place "earlier" (i.e. when a lower voltage is applied) in the section 13A than in the section 13B.

The capacitor configuration 10 illustrated in FIG. 1 can be conceived of as a parallel connection of two capacitors with different coercitive voltages. However, it can also be composed (not illustrated) of two (or more) capacitors which can be driven separately and which have different coercitive voltages. In this case, the lower electrode structure 11 and/or the upper electrode structure 12 are electrically isolated in the region of the junction steps 11' between the sections with a smaller layer thickness 13A and a larger layer thickness 13B.

The ferroelectric capacitor configuration 10 can be manufactured as follows.

After the transistor 2, 3, 4, 5, 6 and the electrical connecting structure 9 are manufactured in the way already described, a depression is etched into the electrical connecting structure 9. The depression is filled with the barrier layer 14. A planarization step can subsequently be carried out.

In a subsequent step, the lower electrode structure 11 is deposited on the covering oxide layer 7 and on the barrier layer 14. A sputtering method can be used to do this. The layer thickness of the deposited electrode structure 11 is D1.

In a following step, part of the lower electrode structure 11 is etched away as far as a remaining layer thickness D2. This forms the step 11' (step height=D1–D2) in the lower electrode structure 11. The step height D1–D2 must be greater here than the desired difference in thicknesses between the two sections 13A and 13B of the ferroelectric material 13.

In a further, optional step, the lower electrode structure 11 of the capacitor configuration 10 is electrically isolated, for example at the foot of the step 11'. In this case, a capacitor configuration composed of (at least) two capacitors is implemented, in which case it must then also be possible to make electrical contact with the capacitor electrode produced underneath the layer section 13B by means of suitable measures (for example a further electrical connecting structure).

Then, by means of spin coating (spin-on method), the ferroelectric material is applied to the lower electrode structure 11. In this process, the ferroelectric material which is dissolved in a solvent is applied to the substrate 1 in droplets and the substrate 1 is then made to rotate using a rotary table device (typically 2000 revolutions per minute). The centrifugal force causes the solvent comprising the ferroelectric material to be thrown outward in a radial direction onto a thin remaining layer. A fluid film, which is thinner than the fluid film over the countersunk section of the lower electrode structure 11, forms on the raised section of the lower electrode structure 11. The solvent already partially vaporizes out of the residue layer of ferroelectric material during the rotation.

In a plurality of subsequent temperature treatment steps, complete vaporization of the solvent is achieved, and the desired ferroelectric connection is caused to crystallize. This brings about a considerable reduction in the thickness of the aforesaid layer and results in the completion of the layer 13 of ferroelectric material shown in FIG. 1.

Generally, the spin coating method described results in thinner layers of ferroelectric material being produced on raised surface sections than on lower-lying surface sections. The degree of thickness variation of the layer 13 of ferroelectric material can therefore be set by means of the difference D1–D2 in levels. The principle can, of course, also be extended to more than two levels and thus to more than two layer thicknesses of the layer 13 of ferroelectric material.

Given a level difference D1–D2=220 nm, the layer thickness of the section 13A of the layer (SBT) 13 of ferroelectric material would be approximately 35 nm, and the layer thickness of the section 13B of the layer 13 of ferroelectric material would be approximately 60 nm.

In order to complete the capacitor configuration 10, the upper electrode structure 12 is deposited over the layer 13 of ferroelectric material and, if desired, also divided.

The (outer) structuring of the applied layers 11, 12, 13 for implementing individual capacitor configurations on the substrate can subsequently be carried out by common etching of all three layers 11, 12, 13.

Figure 2:
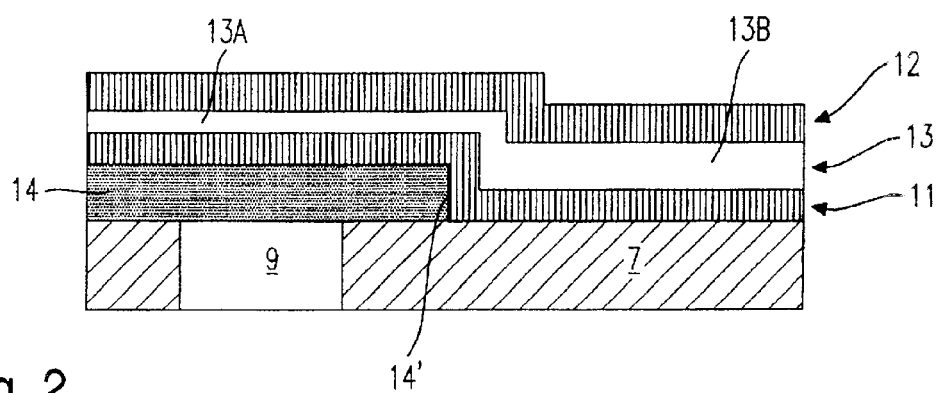
FIG. 2 is a schematic sectional view of a series of layers of the capacitor configuration, illustrating a second exemplary embodiment of the invention.
Figure 3:
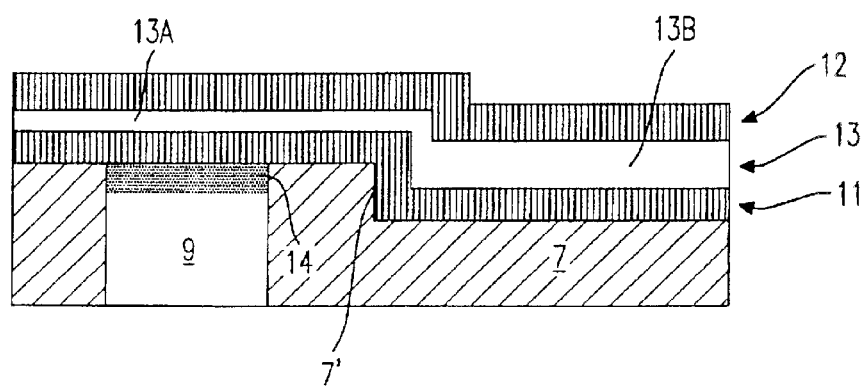
FIG. 3 is a schematic sectional view of a series of layers of the capacitor configuration, illustrating a third exemplary embodiment of the invention.

Further embodiment variants for producing suitable surface topologies of the lower electrode structure 11 are clarified with reference to FIGS. 2 and 3. Corresponding parts are provided with the same reference symbols.

Referring now to FIG. 2, a barrier layer 14 is deposited on the covering oxide layer 7 after the transistor 2, 3, 4, 5, 6 and the electrical connecting structure 9 are manufactured.

The barrier layer 14 is then removed in certain regions leaving the barrier layer step 14'.

In a subsequent step, the lower electrode structure 11 is deposited. The barrier layer step 14' is transferred into the surface profile of the lower electrode structure 11.

After optional internal structuring (division) of the lower electrode structure 11, the layer 13 of ferroelectric material is produced using the spin coating method which has already been described. Finally, the upper electrode structure 12 is applied and, if appropriate, suitably divided.

According to a third exemplary embodiment, as illustrated in FIG. 3, a depression is firstly etched into the electric connecting structure 9 after the transistor 2, 3, 4, 5, 6 and the electrical connecting structure have been manufactured as in the first embodiment variant.

The depression is subsequently filled with the barrier layer 14 by depositing barrier layer material and by further suitable means (for example planarization).

In a following process step, a step 7' is etched into the covering oxide layer 7.

The lower electrode structure 11 is then deposited on the covering oxide layer 7 provided with the step 7', the step 7' being transferred into the surface topology of the lower electrode structure 11 as in the second method variant.

The following process steps (production of the layer 13 of ferroelectric material with varying layer thickness, production of the upper electrode structure 12) can then be carried out in precisely the same way as in the first and second method variants.

All the method variants are functionally comparable and always permit a thickness variation of the layer 13 of ferroelectric material to be produced on an underlying surface with a plurality of different levels within one operation.

We claim:

1. A method of manufacturing a ferroelectric capacitor configuration with at least two different coercive voltages, which comprises the following steps:

depositing an electrically conductive oxygen diffusion barrier layer over a structure including a semiconductor substrate;

removing the barrier layer in certain regions for producing a step in the barrier layer;

depositing a first electrode structure onto the step in the barrier layer, transforming the barrier layer step into a step of the surface profile of the first electrode structure;

spin-coating a layer of ferroelectric material onto the first electrode structure, causing the step in the surface profile of the first electrode structure to provide for a first region of the ferroelectric material of a first layer thickness disposed over a lower level of the step and a second region of the ferroelectric material of a second layer thickness disposed over an upper level of the step, the first and second layer thicknesses being different, and the first and second regions of ferroelectric material with different layer thicknesses resulting in the two different coercive voltages in the ferroelectric capacitor configuration; and producing a second electrode structure on the layer of ferroelectric material.

2. The method according to claim 1, which comprises dividing the first electrode structure to form at least two capacitors.

3. The method according to claim 1, which comprises dividing the second electrode structure to form at least two capacitors.

* * * * *